(12) United States Patent
Espinoza-Ibarra et al.

(10) Patent No.: US 9,405,339 B1
(45) Date of Patent: Aug. 2, 2016

(54) POWER CONTROLLER

(75) Inventors: Ricardo Ernesto Espinoza-Ibarra, San Diego, CA (US); Michael Bozich Calhoun, Roseville, CA (US); Dennis Carr, Roseville, CA (US); Teddy Lee, Roseville, CA (US); Lidia Warnes, Roseville, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 982 days.

(21) Appl. No.: 11/796,929

(22) Filed: Apr. 30, 2007

(51) Int. Cl.
*G06F 1/18* (2006.01)
*G06F 1/26* (2006.01)
*G11C 5/14* (2006.01)

(52) U.S. Cl.
CPC *G06F 1/26* (2013.01); *G11C 5/143* (2013.01); *G06F 1/189* (2013.01)

(58) Field of Classification Search
USPC .................................. 713/100, 300
See application file for complete search history.

(56) References Cited

U.S. PATENT DOCUMENTS

| | | | |
|---|---|---|---|
| 5,396,102 A | 3/1995 | Toshio et al. | |
| 5,440,755 A | 8/1995 | Harwer et al. | |
| 5,901,070 A * | 5/1999 | Trainor | 700/298 |
| 5,935,252 A * | 8/1999 | Berglund et al. | 713/300 |
| 6,215,727 B1 | 4/2001 | Parson et al. | |
| 6,347,367 B1 | 2/2002 | Dell et al. | |
| 6,363,450 B1 * | 3/2002 | Lash et al. | 710/301 |
| 6,392,946 B1 | 5/2002 | Wu et al. | |
| 6,467,048 B1 | 10/2002 | Olarig et al. | |
| 6,507,888 B2 | 1/2003 | Wu et al. | |
| 6,779,075 B2 | 8/2004 | Wu et al. | |
| 6,826,113 B2 | 11/2004 | Ellis et al. | |
| 7,143,298 B2 | 11/2006 | Wells et al. | |
| 7,280,373 B2 | 10/2007 | Aizawa | |
| 7,292,950 B1 | 11/2007 | Resnick | |
| 7,379,316 B2 | 5/2008 | Rajan | |
| 7,475,316 B2 | 1/2009 | Cowell et al. | |
| 7,532,537 B2 | 5/2009 | Solomon et al. | |
| 7,539,810 B2 | 5/2009 | Gower et al. | |
| 7,577,039 B2 | 8/2009 | Yang et al. | |
| 2004/0163002 A1 * | 8/2004 | Doblar et al. | 713/300 |
| 2004/0178682 A1 * | 9/2004 | Jablonski | G06F 1/24 307/75 |
| 2005/0024977 A1 * | 2/2005 | Ong | G11C 29/1201 365/232 |
| 2005/0066071 A1 * | 3/2005 | Cohen | G06K 7/0047 710/8 |
| 2005/0198399 A1 * | 9/2005 | Stancil | G06F 1/266 709/249 |
| 2006/0047899 A1 | 3/2006 | Ilda et al. | |
| 2006/0146629 A1 | 7/2006 | Lee | |
| 2006/0155517 A1 | 7/2006 | Dobbs et al. | |
| 2006/0174140 A1 * | 8/2006 | Harris | G11C 5/04 713/300 |
| 2006/0236134 A1 * | 10/2006 | Kamepalli et al. | 713/300 |
| 2007/0192563 A1 | 8/2007 | Rajan et al. | |
| 2007/0239906 A1 | 10/2007 | Vakil et al. | |
| 2008/0052462 A1 | 2/2008 | Blakely et al. | |

(Continued)

OTHER PUBLICATIONS

JEDEC Standatd, FBDIMM: Architecture and Protocol, JESD206. PDF © JEDEC Solid State Technology Association 2007, Arlington, http://www.jedec.org/download/search/JESD206.pdf Section 2.1.3 (AMB addressing) table 2-4 showing the DS [3:0] usage.

(Continued)

*Primary Examiner* — Kim Huynh
*Assistant Examiner* — Brandon Kinsey
(74) *Attorney, Agent, or Firm* — Wagner Blecher, LLP

(57) ABSTRACT

A closed-loop controller of an apparatus in an example operates a set of switches to dynamically configure power rails to an industry-standard socket.

20 Claims, 9 Drawing Sheets

(56) References Cited

U.S. PATENT DOCUMENTS

| | | | |
|---|---|---|---|
| 2008/0059816 A1* | 3/2008 | Paniagua et al. | ............. 713/300 |
| 2008/0077731 A1 | 3/2008 | Forrest et al. | |
| 2008/0091888 A1 | 4/2008 | Sandy | |
| 2008/0126690 A1 | 5/2008 | Rajan et al. | |
| 2008/0181021 A1 | 7/2008 | Thayer | |
| 2008/0228970 A1* | 9/2008 | Schneider | ............. G06F 13/409 710/104 |
| 2008/0250292 A1 | 10/2008 | Djordjevic | |
| 2008/0256281 A1 | 10/2008 | Fahr et al. | |
| 2009/0020608 A1* | 1/2009 | Bennett et al. | ................ 235/441 |
| 2009/0101711 A1 | 4/2009 | Grayson | |

OTHER PUBLICATIONS

Same Document Section 2.1.3 paragraph 3 shows that for DRAM addressing one can only use DS [2:0].

Same Document Section 4.2.3 find the FBD command encoding protocol. This is the same protocol that would be used by disclosure 63, this table also shows the RS (rank selection bit).

Same Document Section 4.2.4 find information on DRAM commands and a DRAM comman mapping example—this section (paragraph 3) explains the use of the RS bit according to the FBD spec.

Same Document Section 4.4.2 gives a write timing example and describes the use of write FIFOs by the AMB.

Same Document Section 4.4.2.1 describes the use of the WS bits according to the FBD protocol.

Torres, Gabriel "How FB-DIMM Memories Work", http://www.hardwaresecrets.com/article/266.

Torres, Gabriel, "How FB-DIMM Memories Work", http://www.hardwaresecrets.com/article/266, published Dec. 23, 2005.

* cited by examiner

POWER CONTROLLER

BACKGROUND

DIMM (dual in-line memory module) technology has random access memory (RAM) integrated circuits (ICs) mounted on a printed circuit board (PCB). Various types of DIMMs exist. DDR SDRAM (Double Data Rate Synchronous Dynamic Random Access Memory) DIMM technology has a parallel external interface. Fully buffered DIMM or FB-DIMM technology has a serial external interface.

An FB-DIMM connector and/or socket has a number of pins reserved for ground (GND) connections, power connections, signal connections, or no connections. The pins reserved for power connections are subdivided to provide the different power and/or voltage rails that are needed by an industry-standard FB-DIMM. The power and/or voltage rails are standby 3.3V for the field replaceable unit (FRU) such as an FB-DIMM and/or a riser card, 1.5V for an Advanced Memory Buffer (AMB), 1.8V and 0.9V for the DDR2 DRAMs, and 1.5V and 0.75V for the DDR3 DRAMs.

The Advanced Memory Buffer (AMB) employed in FB-DIMM technology has a serial connection to a memory controller, and a parallel connection to dynamic random access memory (DRAM). The AMB on each FB-DIMM translates the communication in serial point-to-point link protocol received from the memory host controller to DDR2 or DDR3 SDRAM parallel protocol transmitted to the DRAMs as read, write, refresh, etc. operations within the FB-DIMM.

FB-DIMM architecture uses a southbound (SB) high speed link to send command and write data information from the memory host controller to the AMB on each FB-DIMM and a northbound (NB) high speed link to transfer read data from the AMBs on the FB-DIMMs to the memory host controller. The AMBs transfer read/write command and data to the DRAMs on each FB-DIMM. The high speed serial link interface between the memory host controller and the FB-DIMMs employs frames having cyclic redundancy check (CRC) with the data to transfer the data. The interface between each AMB and the DRAMs uses the DDR2 or DDR3 SDRAM parallel protocol to transfer data, address, and control.

DESCRIPTION OF THE DRAWINGS

Features of exemplary implementations of the invention will become apparent from the description, the claims, and the accompanying drawings in which:

DETAILED DESCRIPTION

Figure 1:
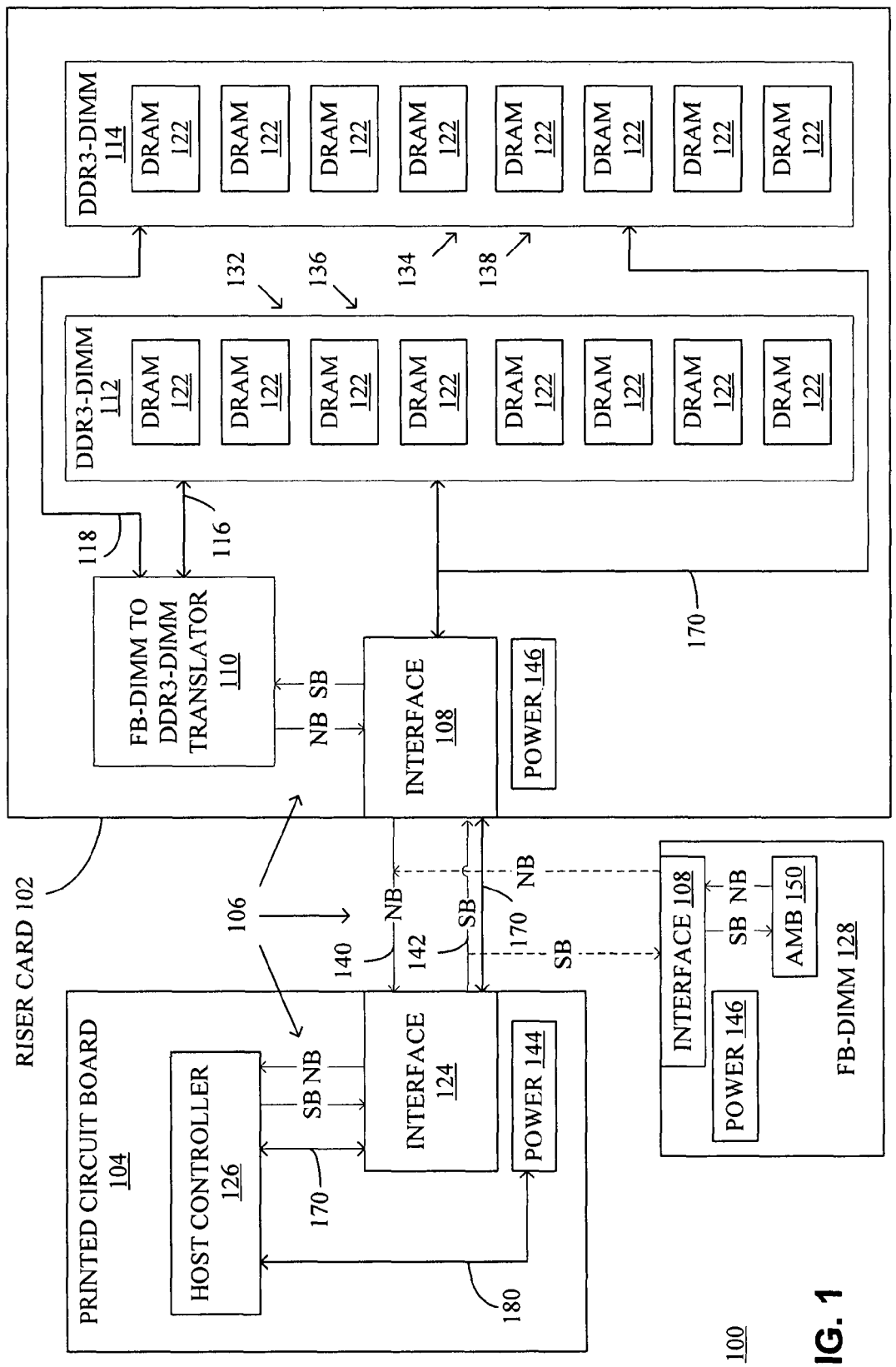
FIG. 1 is a representation of an implementation of an apparatus that comprises one or more riser boards and/or cards, a system board and/or printed circuit board (PCB), one or more serial protocol busses, one or more serial protocol memory modules, one or more parallel protocol memory modules, one or more parallel protocol busses, and/or one or more additional busses.

Referring to the BACKGROUND section above, a system that has limited space on the PCB in an example can be limited to relatively few DIMM sockets. This presents a challenge to a desire for increased memory capacity in the system. An extender board and/or riser card in an example can plug into the FB-DIMM socket on the PCB and connect with a plurality of DIMMs, for example, FB-DIMMs.

To meet the electrical requirements of the DIMMs, it may be desirable at times for the riser card to have a capability to perform local regulation of voltage such as by having local point-of-load (POL) power converters, for example, local voltage regulator modules (VRMs). An exemplary approach supplies and/or feeds 12V to the local voltage regulator modules for their local derivation and/or generation of sets of voltages such as: 1.5V, 1.8V, and 0.9V; 1.8V and 0.9V; 1.5V and 0.75V; or another selection and/or arrangement of voltages. An exemplary controller can dynamically configure the switches that provide power to a specific socket to provide the correct and/or desired power and/or voltage rails. An exemplary approach allows one to have a common interface for the PCB with a variety of available and/or possible memory configurations. An exemplary implementation employs a closed-loop control that operates a set of switches that dynamically configure the power and/or voltage rails, for example, provided to an industry-standard socket and/or connector for plugging in FB-DIMMs or FB-DIMM compatible interfaces. An exemplary implementation allows customizable power delivery to a standard FB-DIMM protocol socket, for example, to enable riser cards.

If one does not want to modify the memory host controller interface on the PCB but wants to reduce the number of AMBs in the system in an example one may install an exemplary translator on the PCB, or on a riser card coupled with the PCB. An exemplary implementation provides one or more power and/or voltage rails on the FB-DIMM socket for the translator. An exemplary approach provides different power and/or voltage rails in an example depending on which generation of FB-DIMM and/or DDR technology an exemplary translator employs. An exemplary controller can automatically and dynamically switch in the correct power and/or voltage rails to each individual socket on the PCB.

An exemplary translator serves to communicate with the memory host controller on the SB and NB high speed serial interface and drive up to sixteen (16) ranks through a DDR-DIMM interface. An exemplary rank comprises all the DRAM devices that can be selected by a select signal. An exemplary select signal comprises a chip select signal. The DDR-DIMM interface of the translator in an example may be connected to industry standard registered and/or unbuffered DDR-DIMMs that do not employ AMBs. The DDR-DIMM interface of the translator in an example may support one or two DDR channels. An exemplary channel comprises all the DDR-DIMMs that are connected to a DDR data bus.

Current FB-DIMM technology employs an expensive and power-hungry AMB device on each FB-DIMM installed in the system. The current FB-DIMM protocol allows for a maximum per FB-DIMM channel of eight (8) DDR DIMMs that each comprises two (2) ranks of DRAM devices. Under the current FB-DIMM protocol, each FB-DIMM comprises an AMB that can select a maximum of two (2) ranks of DRAM devices. The AMB increases the cost of the FB-DIMM. The AMB consumes a relatively large amount of power, making the power and cooling of the system more expensive and/or difficult in using the FB-DIMM technology.

An exemplary approach allows employment of an existing standard such as FB-DIMM protocol and an existing memory controller design. An exemplary translator allows employment of parallel protocol DIMMs instead of the expensive, power hungry serial protocol FB-DIMMs. An exemplary implementation architects a select operation of the translator, for example, an IC and/or chip select operation. An exemplary implementation omits the AMBs and instead employs a single FB-DIMM protocol to DDR translator to select up to, for example, sixteen (16) ranks. The translator in an example is installed on the PCB or a riser card. An exemplary implementation accommodates and/or employs a standard FB-DIMM high-speed interface while increasing bandwidth and capacity of a memory subsystem. An exemplary implementation serves to select DDR-DIMMs for one or more DDR channels. The FB-DIMM protocol provides for three (3) FB-DIMM select bits (binary digits) DS0 to DS2 and a rank select bit RS. An existing memory host controller drives these bits to select one of the eight (8) two (2) rank FB-DIMMs that may be installed in an FB-DIMM channel. Instead of the previous employment of the bits to select FB-DIMMs, an exemplary translator may employ the bits to select ranks on registered and/or unbuffered DDR-DIMMs that do not employ AMBs. An exemplary employment of an FB-DIMM protocol to DDR translator serves to address the maximum number of ranks allowed by the FB-DIMM protocol, for example, with just one FB-DIMM protocol to DDR translator serving to drive the eight (8) DDR DIMMs, reducing the system cost, and/or simplifying, enhancing, and/or reducing requirements for power and/or cooling.

FB-DIMMs are based on serial data transfer technology while DDR3 SDRAM DIMMs are based on parallel data transfer technology. An exemplary implementation allows both different memory technologies to be used in a same package. Full memory speed for both FB-DIMMs and DDR3 SDRAM DIMMs in an example is achievable. An exemplary translator comprises a translator riser board and/or card. The riser card in an example comprises a circuit board and/or card that connects directly to the PCB and allows addition of cards to the PCB by connection through the riser card. Another exemplary implementation omits the riser card and locates the translator in the PCB. In an exemplary implementation, a total number of DDR DIMM connectors on the riser card outside the PCB can be the same as a total number of FB-DIMM connectors on the PCB. An exemplary approach allows a user to choose between serial and parallel memory technologies without loss in a total quantity of DDR DIMM modules and FBDIMM modules allowable in the system regardless of the memory technology the user and/or customer chooses to use.

An exemplary approach allows an FB-DIMM protocol to DDR translator to be transparent to an FB-DIMM memory controller. An exemplary implementation allows the use of lower-cost industry standard DIMMs on the lower-speed interface without modification to the FB-DIMM memory controller.

An exemplary implementation comprises switches on the main system board that can be turned on or off to bridge different voltage rails, as needed, to provide the desired and/or necessary voltages and/or power to the device plugged into the industry-standard DIMM socket. If an industry standard DIMM or a DIMM riser card that is powered through employment of point of load converters (POLs) and/or voltage regulator modules external to the PCB is plugged into the socket, the voltage rails routed to the socket in an example are provided through the assigned power pins for each respective voltage and/or power rail. If a DIMM riser card with voltage regulator modules is plugged into the slot, then the socket pins assigned for power in an example are shorted together to provide the voltage rail needed by the voltage regulator modules to generate and/or derive their respective power voltage and/or rails. Voltage and/or power pins and/or connectors in an example can be selectively shorted together, for example, depending on how many of the voltage and/or power rails are able to be generated by the local voltage regulator modules. An exemplary host controller operates the switches. The host controller in an example knows what is plugged into each DIMM socket, for example, through System Product Division (SPD) cataloging. The host controller in an example can then activate the different power switches as appropriate for each specific slot.

Figure 2:
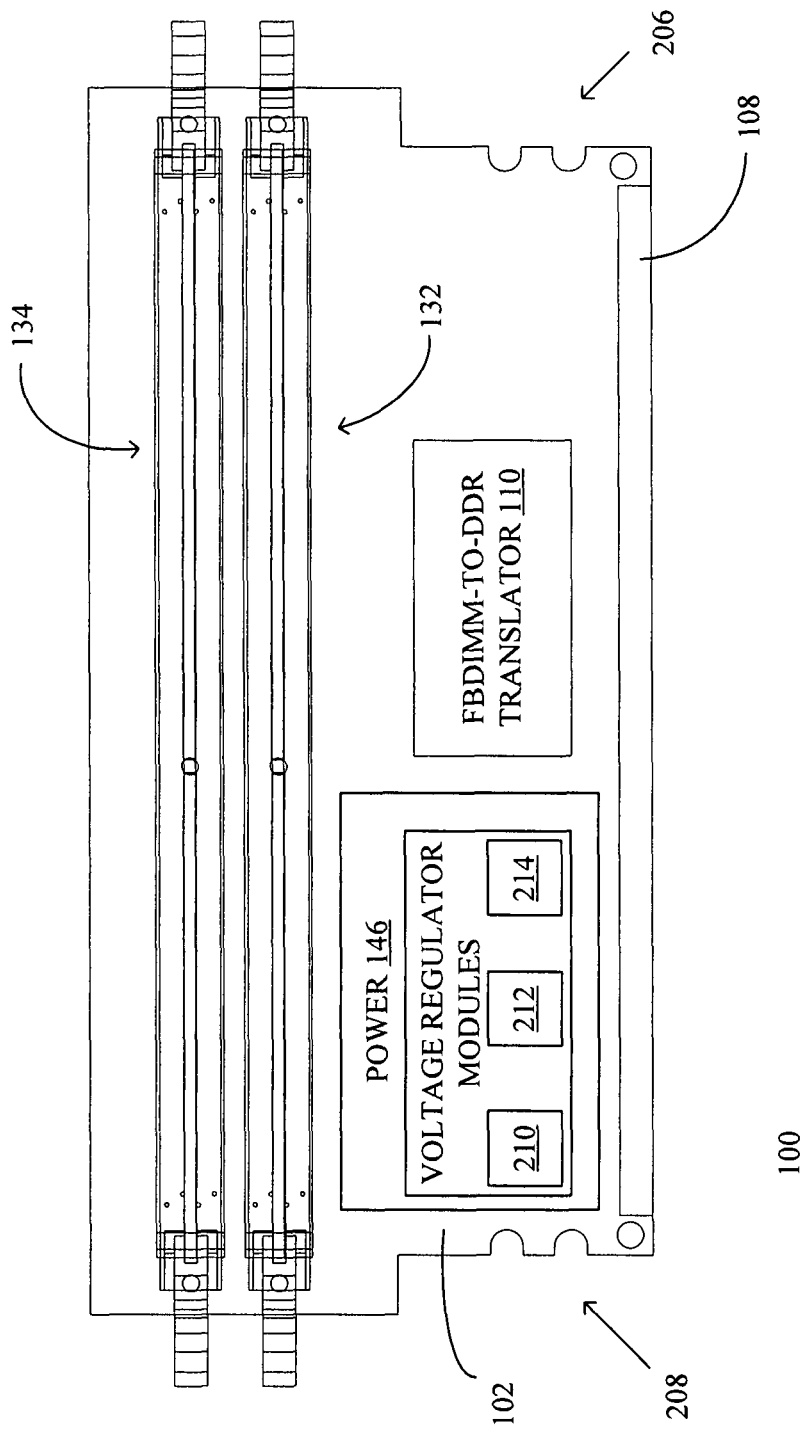
FIG. 2 is an enlarged, side representation of a riser card of an implementation of the apparatus of FIG. 1.
Figure 3:
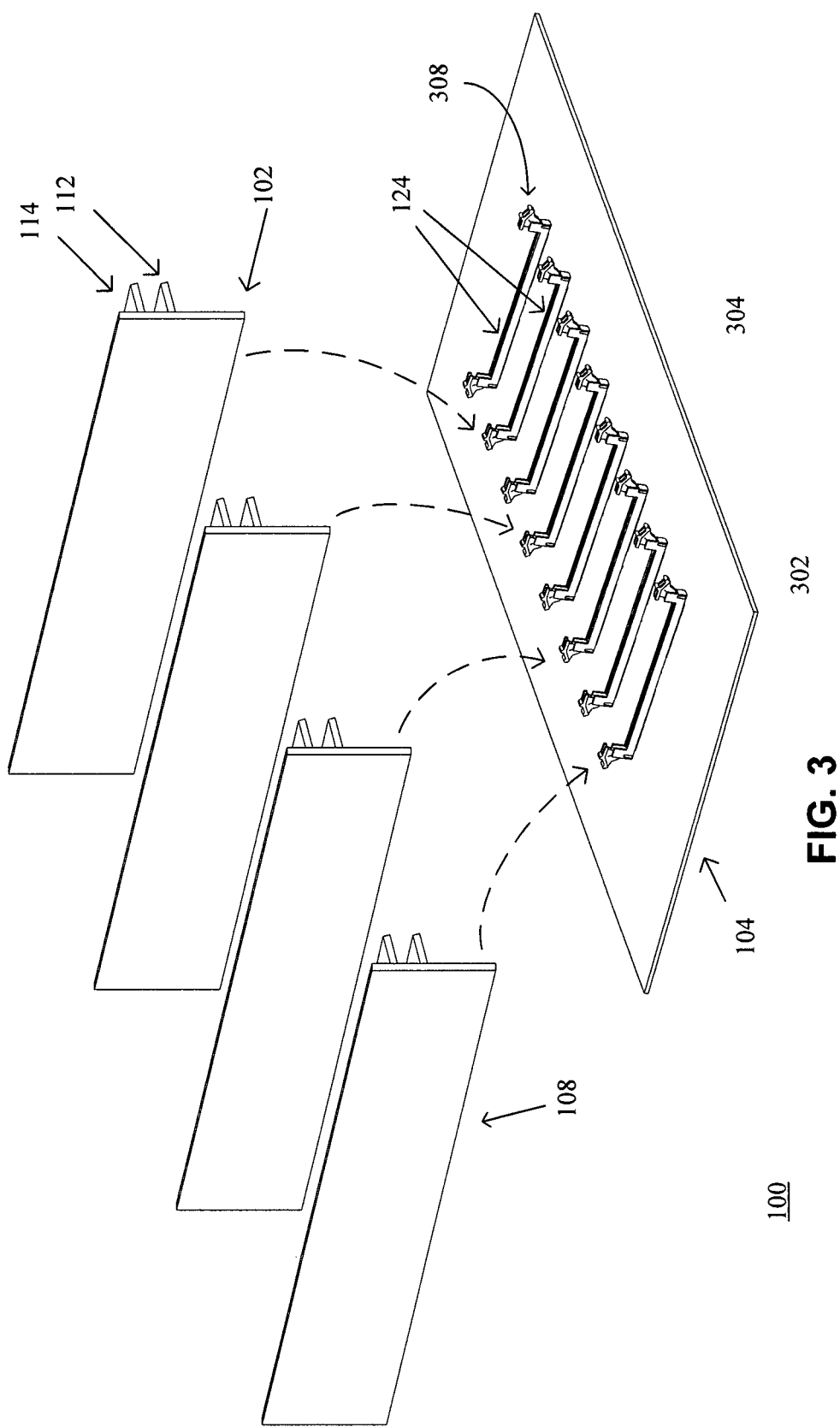
FIG. 3 is a perspective, cutaway, partial, exploded representation of a plurality of riser cards, a plurality of parallel protocol memory modules, and the PCB of an implementation of the apparatus of FIG. 1, and illustrates an exemplary vertical and/or orthogonal arrangement of the parallel protocol memory modules.
Figure 4:
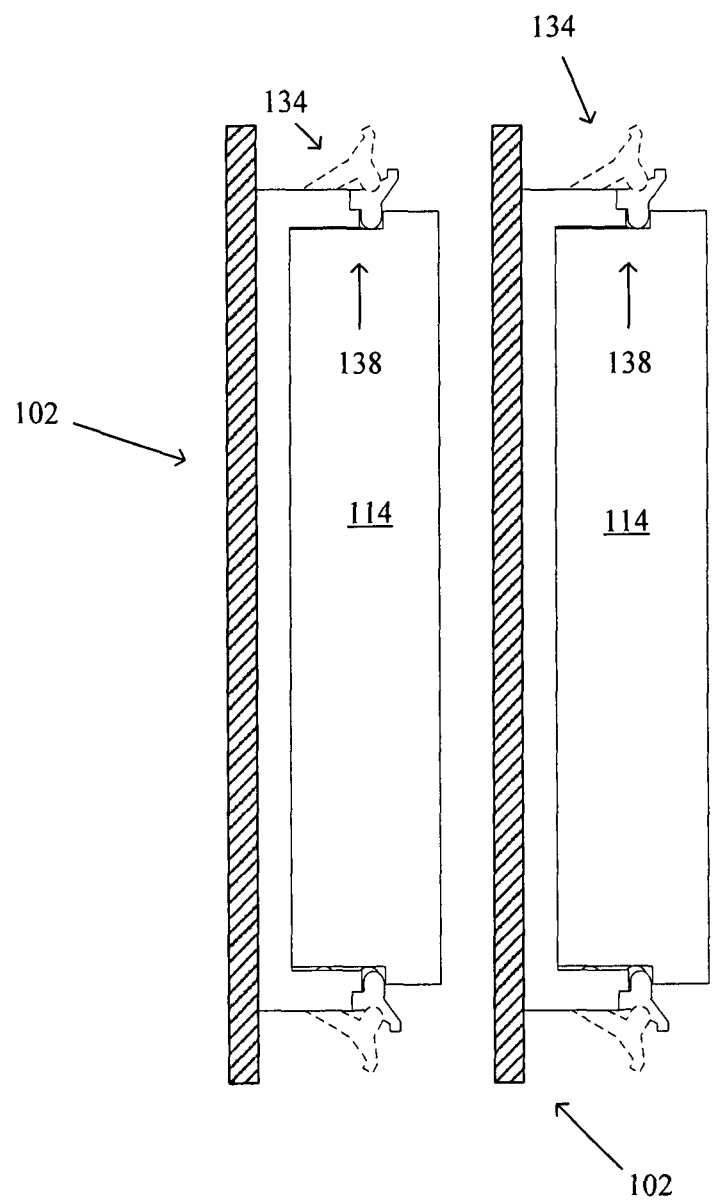
FIG. 4 is a top, partial representation of two riser cards and two parallel protocol memory modules of the implementation of the apparatus of FIG. 3.

Turning to FIGS. 1 through 4, an implementation of an apparatus 100 in an example comprises one or more riser boards and/or cards 102, a system board and/or printed circuit board (PCB) 104, one or more serial protocol busses 106, one or more serial protocol memory modules 128, one or more parallel protocol memory modules 112, 114, one or more parallel protocol busses 116, 118, and/or one or more additional busses 170. The PCB 104 in an example comprises one or more serial protocol interfaces 124, a system management entity, memory controller, and/or host controller 126, and a voltage and/or power component 144. An exemplary serial protocol memory module 128 comprises a fully buffered dual in-line memory module (FB-DIMM, FBDIMM, and/or FBD). The serial protocol memory module 128 and the riser card 102 in an example each comprise an interface 108 and a voltage and/or power component 146. The serial protocol memory module 128 in an example further comprises an Advanced Memory Buffer (AMB) 150. The AMB 150 in an example translates communication received from the host controller 126 to DDR2 or DDR3 SDRAM parallel protocol transmitted to the DRAMs within the FB-DIMM as an exemplary serial protocol memory module 128. The riser card 102 in an example further comprises a translator 110 and one or more parallel protocol connectors and/or interfaces 132, 134 (FIGS. 1 and 4). An exemplary bus 170 comprises a serial presence detect (SPD) bus and/or sideband interface. The host controller 126 in an example employs and/or accesses the bus 170 to determine and/or identify a device plugged into the interface 124 of the PCB 104. The host controller 126 in an example employs and/or accesses a sideband interface and/or bus 180 to communicate with the power component 144. The bus 180 in an example comprises a control bus with exemplary control lines, for example, control line 514 (FIG. 5) such as V12P0_ENABLE, control line 516 (FIG. 5) such as V1P5_ENABLE, control line 518 (FIG. 5) such as V1P8_ENABLE, control line 520 (FIG. 5) such as V0P9_ENABLE.

The serial protocol interfaces 108, 124 in an example comprise FB-DIMM memory module connectors (FB-DIMM connectors). An exemplary FB-DIMM memory module connector as the serial protocol interface 108 in an example comprises two hundred forty (240) pins and/or fingers that comply with standards of the JEDEC Solid State Technology Association (previously known as the Joint Electron Device Engineering Council; World Wide Web jedec.org). The pins of an exemplary interface 108 are vertical and/or orthogonal. The pins of another exemplary interface 108 are angled and/or oblique. The serial protocol interface 108 in an example comprises gold pins that fit directly into an FB-DIMM memory module connector and/or FB-DIMM connector as the parallel protocol interface 124. An exemplary the FB-DIMM memory module connector as the serial protocol interface 124 comprises slots, connectors, and/or holes that receive, engage, mesh, couple, connect, and/or mate with pins as an exemplary interface 108. The riser card 102 in an example fits directly into the FB-DIMM connector as the serial protocol interface 124. An edge of the riser card 102 in an example comprises gold fingers and/or pins that allow the riser card 102 to plug directly into the FB-DIMM memory module connector as the serial protocol interface 124. As discussed herein with reference to FIG. 2, the riser card 102 in an example comprises notches 206, 208 at both ends to allow the riser card 102 to be accommodated by end latches 308 (FIG. 3), for example, of a standard FB-DIMM memory module connector as an exemplary interface 124.

Figure 6:
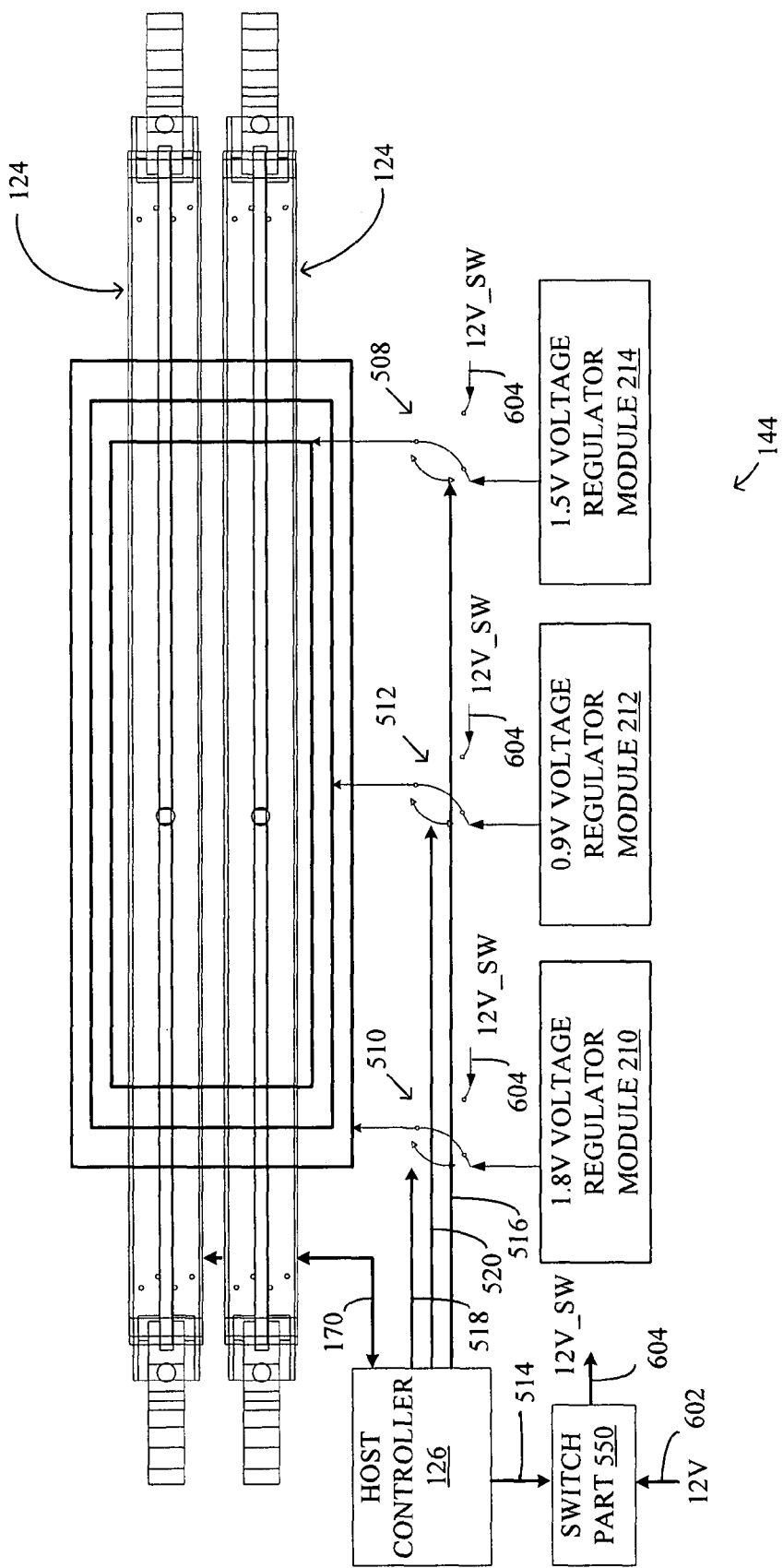
FIG. 6 is a partial representation of a host controller, power component, and interface of the PCB of an implementation of the apparatus of FIG. 1.

As discussed herein, an exemplary power component 144, 146 of the PCB 104 and/or riser card 102 in an example comprises one or more voltage regulator modules 210 (FIGS. 2 and 6), 212 (FIGS. 2 and 6), 214 (FIGS. 2 and 6). The translator 110 in an example comprises an exemplary implementation of an algorithm, procedure, program, process, mechanism, engine, model, coordinator, module, application, code, and/or logic. An exemplary translator 110 comprises logic, a command-memory, storage, and/or buffer, and a parallel protocol interface and/or one or more channel interfaces.

The parallel protocol memory modules 112, 114 in an example comprise respective parallel protocol connectors and/or interfaces 136, 138 (FIGS. 1 and 4) and a plurality of parallel memory devices 122. For example, the parallel protocol memory module 112, 114 comprises eight, nine, eighteen parallel, and/or any selected and/or desired number of memory devices 122. Exemplary numbers of instances of the parallel protocol memory modules 112, 114 on an exemplary riser card 102 comprise any selected and/or desirable number, for example, two, four, eight, or sixteen parallel protocol memory modules 112, 114.

Exemplary parallel protocol memory modules 112, 114 comprise registered and/or unbuffered DIMMs, for example DDR 2 or 3 DIMMs. An exemplary parallel memory device 122 comprises a dynamic random access memory (DRAM). One or more exemplary implementations employ plural rank parallel memory modules, such as two-rank and/or four-rank parallel memory modules, as one or more of the parallel protocol memory modules 112, 114. An exemplary rank comprises all the parallel memory devices 122 that can be selected by an individual select signal. An exemplary riser card 102 and exemplary parallel protocol memory modules 112, 114 in an example serve to take a place of, substitute for, and/or provide an upgrade from a serial protocol memory module 128 such as a fully buffered dual in-line memory module (FB-DIMM, FBDIMM, and/or FBD).

The serial protocol bus 106 in an example comprises a high speed serial bus. Exemplary implementations of the serial protocol bus 106 comprise industry standard high speed serial busses such as FBD (fully buffered DIMM; FB-DIMM), PCI-express (PCIe), and HTx (hyper-transport) busses. The bus 106 as an FB-DIMM bus in an example comprises a northbound (NB) path 140 and a southbound (SB) path 142. An exemplary northbound path 140 comprises fourteen (14) bit (binary digit) lanes carrying read data from memory such as the parallel protocol memory module 112, 114 to a processor such as the host controller 126. An exemplary southbound path 142 comprises ten (10) southbound (SB) bit lanes carrying commands and write data from the processor such as the host controller 126 to memory such as the parallel protocol memory module 112, 114.

An exemplary parallel protocol bus 116, 118 comprises a Double Data Rate (DDR) bus, for example, a DDR3 bus. The parallel protocol busses 116, 118 in an example comprise one or more data and/or strobe busses and one or more control and/or command busses. To allow employment of one or more DDR3 DIMMs as one or more parallel protocol memory modules 112, 114 on a computer system and/or PCB 104 with an existing FB-DIMM connector as the serial protocol interface 124 in an example a user need only plug in riser card 102 into the FB-DIMM connector as the serial protocol interface 124 and install DDR3 SDRAM (Synchronous Dynamic Random Access Memory) DIMMs as the parallel protocol memory modules 112, 114 at parallel protocol interface 132, 134 on the riser card 102. For example, to allow employment of one or more DDR3 DIMMs as one or more parallel protocol memory modules 112, 114 in an example a user need only replace an FB-DIMM as the serial protocol memory module 128 with the riser card 102, and have the DDR3 SDRAM DIMMs as the parallel protocol memory modules 112, 114 coupled with the riser card 102. To allow employment of an FB-DIMM as the serial protocol memory module 128 in an example a user need only replace the riser card 102 with the FB-DIMM as the serial protocol memory module 128.

The FB-DIMM to DDR3 translator IC as the translator 110 in an example receives commands and write data from the host controller 126 and sends read data back to the host controller 126 using the FB-DIMM protocol as a serial memory protocol. The FB-DIMM to DDR3 translator IC as the translator 110 in an example translates the FB-DIMM protocol as the serial memory protocol to DDR protocol as a parallel memory protocol to send transfer commands and read/write data to the DDR3 DIMMs as the parallel protocol memory modules 112, 114. The translator 110 in an example drives one or more DDR busses as the one or more parallel protocol busses 116, 118.

Turning to FIG. 2, the riser card 102 in an example comprises notches 206, 208 at both ends to allow the riser card 102 to be accommodated by end latches (not shown) of a standard FB-DIMM memory module connector as an exemplary interface 124. An exemplary power component 146 of the riser card 102 in an example comprises one or more voltage regulator modules 210, 212, 214. The voltage regulator module 210, 212, 214 in an example is locatable on the card 102 such as to provide additional, extra, and/or sufficient power to the components onboard and/or connected with the riser card 102. An exemplary voltage regulator module 210, 212, 214 serves to derive, generate, and/or route component and/or bus power and/or voltages, as described herein.

Turning to FIG. 3, the serial protocol interfaces 108 of a plurality of riser cards 102 in an example are inserted directly into a respective plurality of FB-DIMM connectors as the serial protocol interfaces 124 on the PCB 104. Referring to FIGS. 1, 3, and 4, DDR3 SDRAM memory as parallel protocol memory modules 112, 114 in an example have respective interfaces 136, 138 inserted on respective DDR3 DIMM connectors as the parallel protocol interfaces 132, 134 of the riser card 102. The PCB 102 in an example is embedded with FB-DIMM memory technology as a serial memory protocol implementation such as through employment of the host controller 126 and the serial protocol interface 124.

Referring to FIG. 4, an exemplary interface 132 comprises a latch that pivots into a holding gap as an exemplary interface 136. An exemplary latch as the interface 132 comprises a standard DIMM connector and/or socket latch. Referring to FIGS. 1 through 4, exemplary interfaces 132, 134, 136, 138 are vertical and/or orthogonal. An exemplary DDR-DIMM interface as the interface 132, 134, 136, 138 in an example comprises connection of two hundred forty (240) pins and/or fingers that comply with standards of the JEDEC Solid State Technology Association (previously known as the Joint Electron Device Engineering Council; World Wide Web jedec.org).

Figure 5:
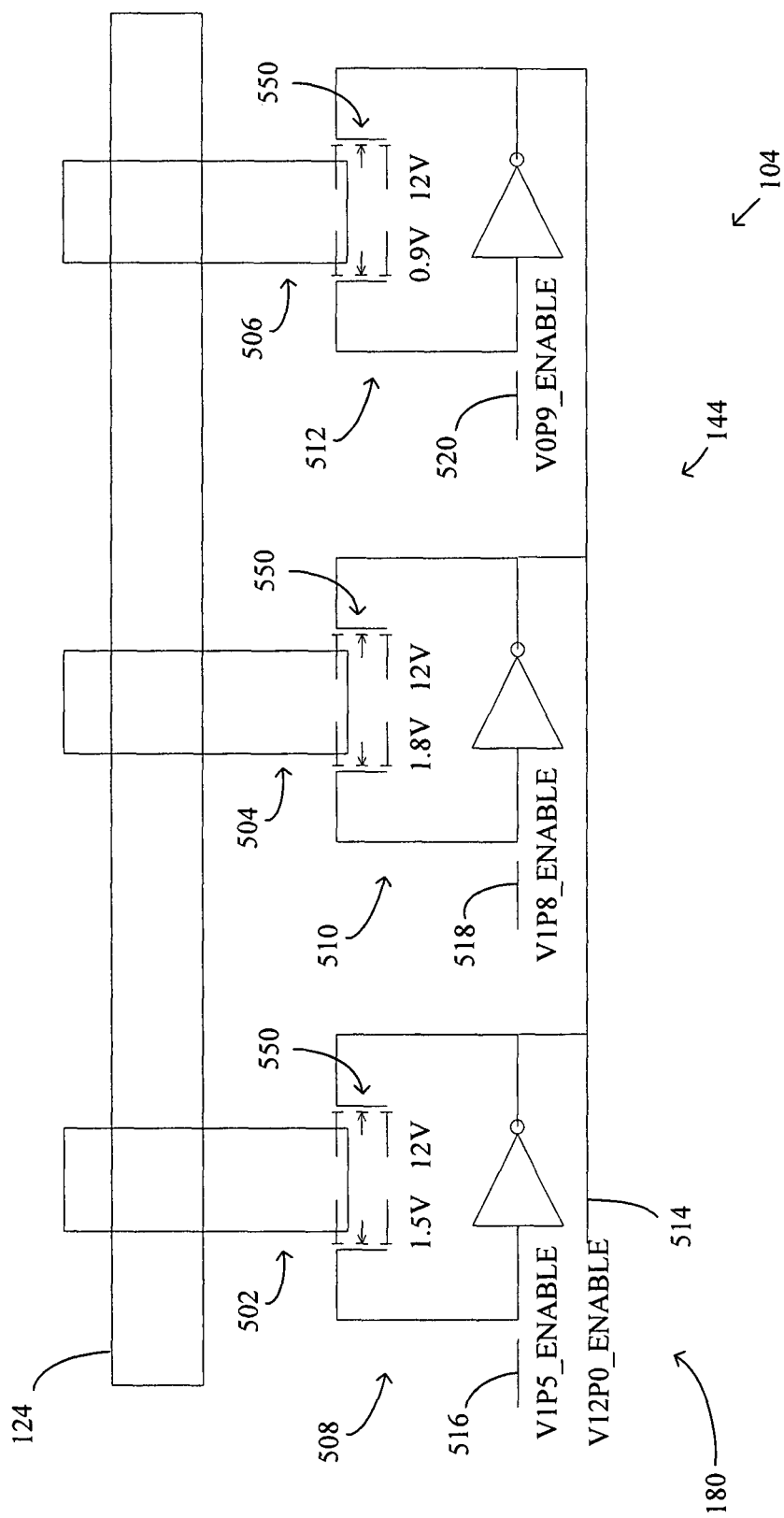
FIG. 5 is a partial representation of a power component and interface of the PCB of an implementation of the apparatus of FIG. 1.

Turning to FIGS. 5 and 6, the power component 144 of the PCB 104 in an example comprises one or more voltage and/or power rails 502, 504, 506, 604 and/or one or more switches 508, 510, 512. The switches 508, 510, 512 in an example comprise a switch part 550. Referring to FIG. 6, the switch part 550 in an example is separate and/or distinct from the switches 508, 510, 512. The interface 124 of the PCB 104 in an example comprises an industry-standard DIMM socket such as an FB-DIMM socket. The host controller 126 (FIG. 1) in an example controls, activates, and/or configures the switches 508, 510, 512 and/or switch part 550 to provide a desired and/or appropriate input on the voltage and/or power rail 502, 504, 506, 604 to the particular socket as the interface 124. The switch part 550 in an example comprises a control switch for the voltage and/or power rail 604 such as a 12V rail to provide an output such as an ON or OFF switched connection. The switch part 550 in an example receives an input 602 such as a system-wide 12V and provides output on the voltage and/or power rail 604. The switch part 550 allows local control of supply of the system-wide 12V rail.

For explanatory purposes, FIGS. 5 and 6 illustrate four exemplary main voltage and/or power rails 502, 504, 506, 604 fed to an FB-DIMM interface as the serial protocol interface 108: 12V, 1.5V, 1.8V and 0.9V. Exemplary sets of voltage and/or power rails 502, 504, 506, 604 fed to the FB-DIMM interface as the serial protocol interface 108 comprise: 1.5V, 1.8V, and 0.9V; 1.8V and 0.9V; 1.5V and 0.75V; 12V, 1.5V, 1.8V, and 0.9V; 12V, 1.8V, and 0.9V; 12V, 1.5V, and 0.75V. As will be appreciated by those skilled in the art, an additional voltage and/or power rail (not shown) may be employed, for example, 3.3V standby. For explanatory purposes, FIG. 5 illustrates as part of the interface 124 exemplary socket connectors clustered together and associated with each of the voltage and/or power rails 502, 504, 506.

With a particular and/or relatively modest and/or small riser card 102 plugged into the interface 124 in an example not all the switches 508, 510, 512 need to be connected to provide 12V. For example, one switch 508, 510, or 512 can be connected to 12V and the other switches 508, 510, 512 left OPEN. In a further example, the same riser card 102 at the same interface 124 or a different FRU such as a larger riser card 102 needs more current and/or power from the 12V rail 502, 504, 506 so the other switches 508, 510, 512 are also connected to 12V source to provide dynamic on-demand supply of 12V to the interface 124.

Turning to FIG. 6, the host controller 126 in an example comprises a closed-control loop that manages the switches 508, 510, 512. Exemplary additional tasks of the host controller 126 comprise temperature monitoring, system health monitoring and alerting, system event logging, fan control. An exemplary implementation adds and/or incorporates the dynamic power-control mechanism in the host controller 126 to help reduce and/or constrain added cost to the system.

Figure 7:
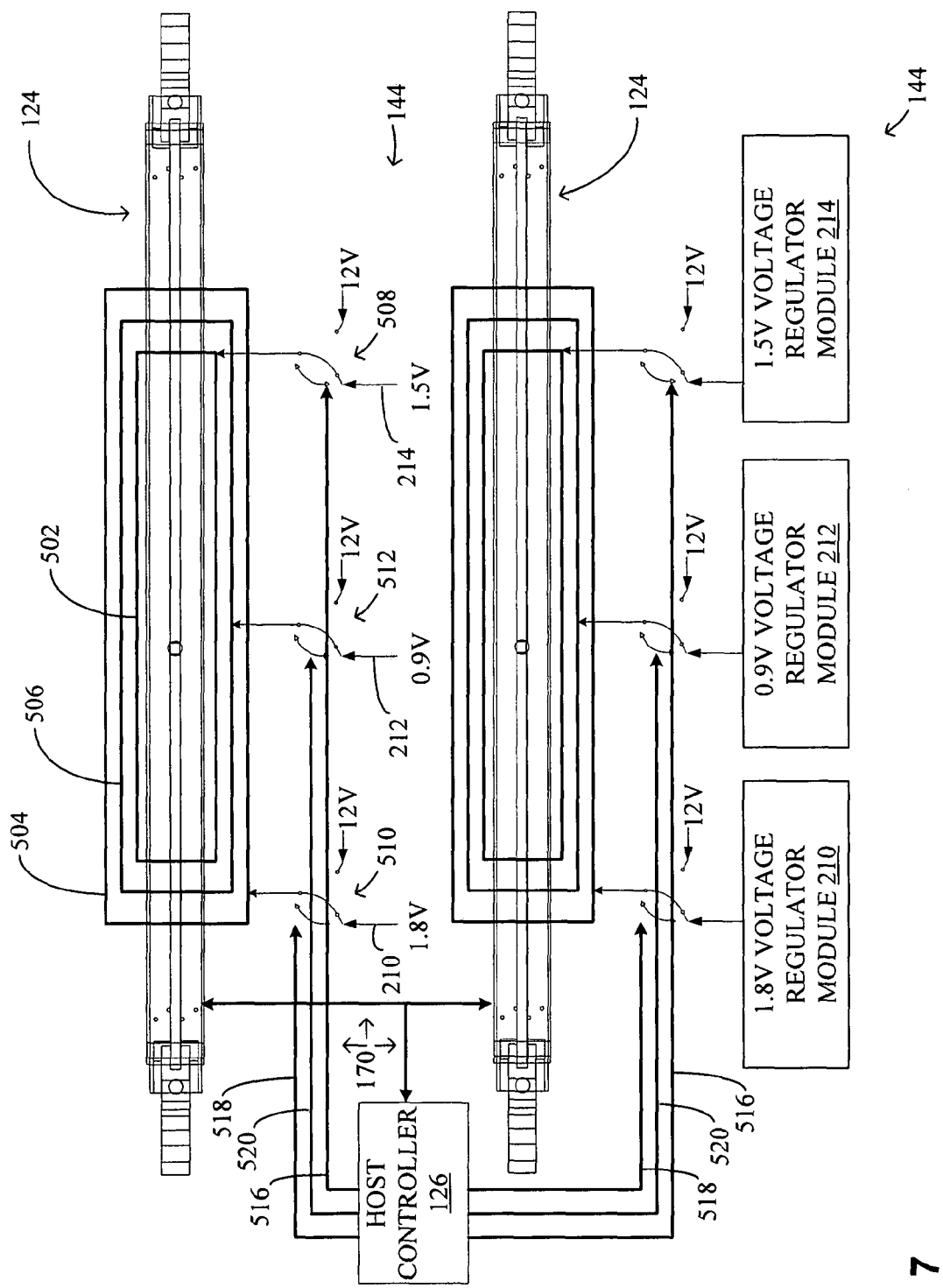
FIG. 7 is similar to FIG. 6 and partially illustrates another implementation of the apparatus of FIG. 1.

Referring to FIG. 6, a same set of switches 508, 510, 512 in an example controls a plurality of interfaces 124 of the PCB. Referring to FIG. 7, different sets of switches 508, 510, 512 in an example control different interfaces 124 of the PCB.

Referring to FIG. 7, one or more portions of the power component 144 in an example connect with one or more interfaces 124 on the PCB 104. A set of voltage regulator modules 210, 212, 214 in an example connects with a plurality of interfaces 124 on the PCB 104. In another example, different sets of voltage regulator modules 210, 212, 214 connect with different interfaces 124 on the PCB 104.

Figure 8:
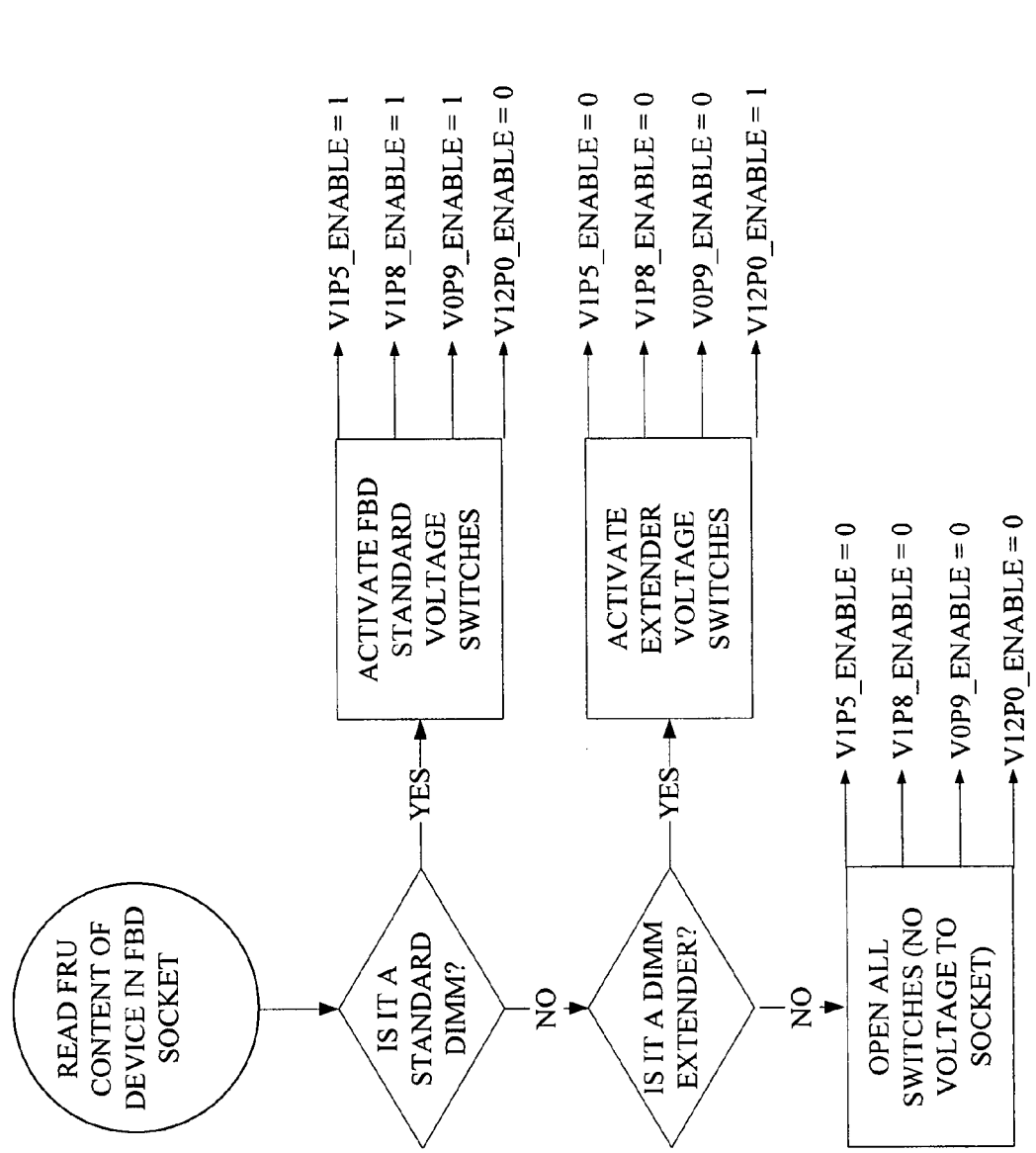
FIG. 8 is a representation of an exemplary logic flow for configuration of power rails to an industry-standard socket as an exemplary interface of the PCB of an implementation of the apparatus of FIG. 1.
Figure 9:
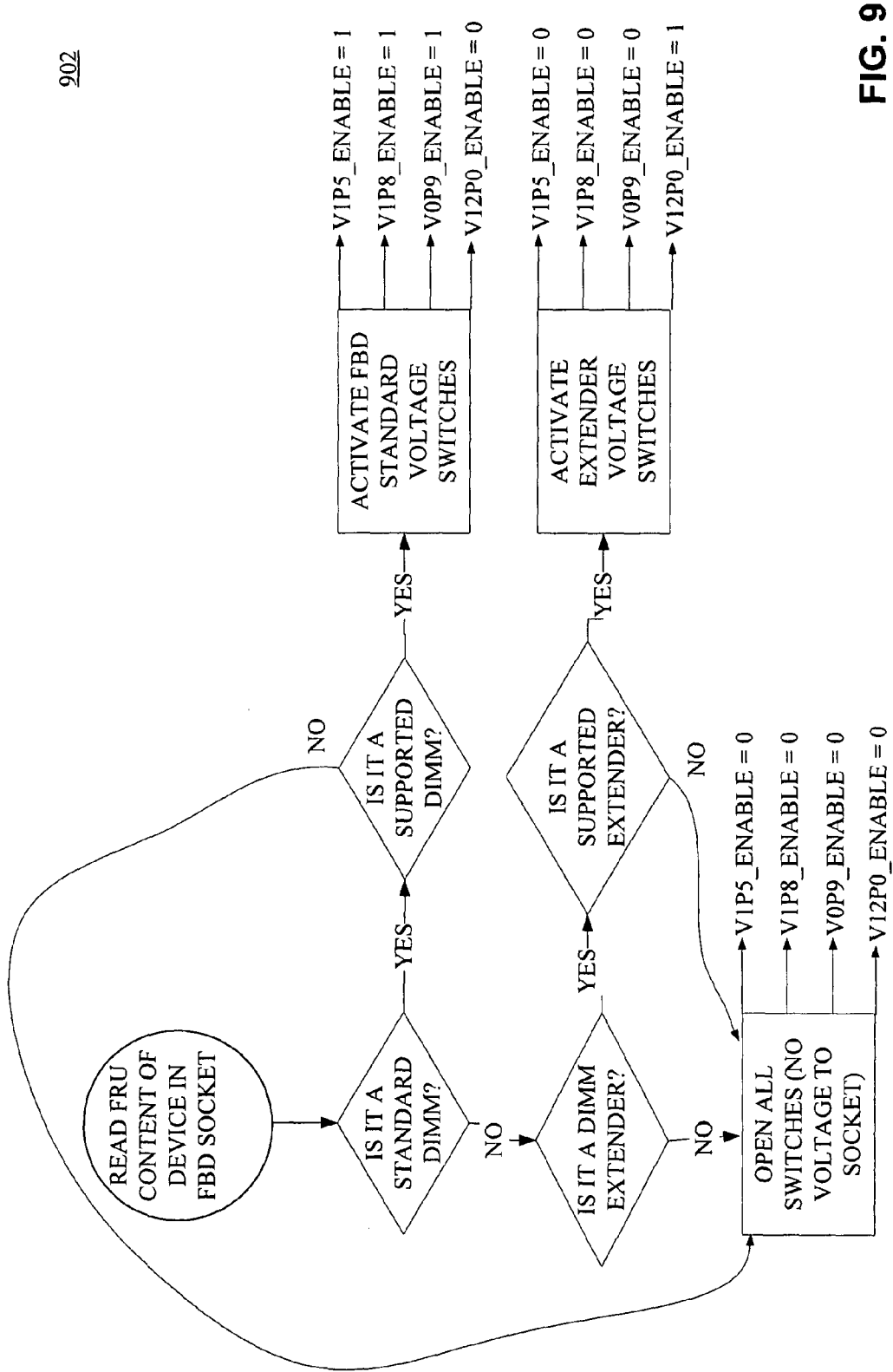
FIG. 9 is a representation of an exemplary logic flow for making a determination that an interface of a field replaceable unit (FRU) such as the riser card or the FB-DIMM is supported at the interface of the PCB of an implementation of the apparatus of FIG. 1.

An illustrative description of an exemplary operation of an implementation of the apparatus 100 is presented, for explanatory purposes. FIG. 8 is a representation of an exemplary logic flow 802 for configuration of power rails to an industry-standard socket as an exemplary interface 124 of the PCB 104. The host controller 126 in an example performs the logic flow 802. FIG. 9 is a representation of an exemplary logic flow 902 for making a determination that an interface 108 of a field replaceable unit (FRU) such as the riser card 102 or the FB-DIMM 128 is supported at the interface 124 of the PCB 104. The host controller 126 in an example performs the logic flow 902.

An exemplary implementation provides a security tool to ensure the system operates according to what is specified and expected. An exemplary implementation incorporates a security feature that ensures the field replaceable unit (FRU) plugged into the socket as the interface 124 is a supported device, for example, by vendor, revision, type, etc.

An exemplary implementation comprises a closed-loop controller that operates a set of switches to dynamically configure power rails to an industry-standard socket.

The closed-loop controller operates the set of switches to dynamically configure the power rails to the industry-standard socket to provide power that is correct for and/or aligned with real-time power needs of a field replaceable unit (FRU) contemporaneous with connection of the FRU with the industry-standard socket. The FRU comprises any of a plurality of available, selectable, and/or desirable FRUs with a variety of corresponding power needs. The FRU comprises any of a plurality of available, selectable, and/or desirable FRUs with a variety of available and/or possible memory configurations. The FRU comprises a fully buffered dual in-line memory module (FB-DIMM). The industry-standard socket corresponds to FB-DIMMs and/or FB-DIMM compatible interfaces. The FRU comprises a riser card.

The industry-standard socket comprises a first industry-standard socket on a printed circuit board (PCB), wherein the set of switches comprises a first set of switches on the PCB that correspond to the first industry-standard socket. The power rails comprise a first set of power rails on the PCB that correspond to the first industry-standard socket. The closed-loop controller operates the first set of switches to automatically and dynamically configure the first set of power rails to the first industry-standard socket to provide power that is correct for and/or aligned with real-time power needs of a first field replaceable unit (FRU) contemporaneous with connection of the first FRU with the first industry-standard socket. The closed-loop controller operates a second set of switches on the PCB to automatically and dynamically configure a second set of power rails on the PCB to a second industry-standard socket on the PCB to provide power that is correct for and/or aligned with real-time power needs of a second field replaceable unit (FRU) contemporaneous with connection of the second FRU with the second industry-standard socket.

A translator, through the industry-standard socket, communicates between a serial memory protocol within a PCB and a parallel memory protocol on and/or coupled through a riser card outside the PCB. The closed-loop controller operates the set of switches to dynamically configure power rails to the industry-standard socket to provide power that is correct for and aligned with a particular generation of a plurality of available generations of FB-DIMM and/or double data rate DDR technology employed by the translator on and/or through the riser card.

The set of switches comprises a plurality of switches. At a first time the closed-loop controller operates the plurality of switches to active one switch of the plurality of switches and deactivate a remainder of the plurality of switches to dynamically configure the power rails to the industry-standard socket to provide power that is correct for and/or aligned with real-time power needs of a first field replaceable unit (FRU) contemporaneous with connection of the first FRU with the industry-standard socket. At a second time the closed-loop controller operates the plurality of switches to active all the plurality of switches to dynamically configure the power rails to the industry-standard socket to provide power that is correct for and/or aligned with real-time power needs of a second field replaceable unit (FRU) contemporaneous with connection of the second FRU with the industry-standard socket.

An exemplary implementation comprises one or more voltage regulator modules on a riser card and a controller. The one or more voltage regulator modules receive power through a serial connection external interface of a printed circuit board (PCB). The controller on the PCB operates a set of switches to dynamically customize power delivery to needs of the one or more voltage regulator modules.

The controller supplies a first voltage through the serial connection external interface to the one or more voltage regulator modules for derivation of one or more second voltages on the riser card. The one or more voltage regulator modules comprise a set of voltage regulator modules. The controller supplies 12V through the serial connection external interface to set of voltage regulator modules for derivation on the riser card of a set of 1.5V, 1.8V, and 0.9V. The one or more voltage regulator modules comprise a set of voltage regulator modules. The controller supplies 12V through the serial connection external interface to set of voltage regulator modules for derivation on the riser card of a set of 1.8V and 0.9V. The one or more voltage regulator modules comprise a set of voltage regulator modules. The controller supplies 12V through the serial connection external interface to set of voltage regulator modules for derivation on the riser card of a set of 1.5V and 0.75V.

The one or more voltage regulator modules comprise a set of voltage regulator modules. A translator, through the serial connection external interface of the PCB, communicates between a serial memory protocol within the PCB and a parallel memory protocol on and/or coupled through the riser card outside the PCB. The set of voltage regulator modules serves to derive a correct voltage for the translator from power received through the serial connection external interface of the PCB. The set of voltage regulator modules serves to route the correct voltage to the translator for operation of the translator.

The one or more voltage regulator modules comprise a set of voltage regulator modules. The serial memory protocol comprises a fully buffered dual in-line memory module (FB-DIMM) protocol within the PCB. The parallel memory protocol comprises a double data rate synchronous dynamic random access memory (DDR SDRAM) protocol on and/or coupled through the riser card outside the PCB. The translator communicates through the serial connection external interface of the PCB between the FB-DIMM protocol within the PCB and the DDR SDRAM protocol on and/or coupled through the riser card outside the PCB. The set of voltage regulator modules serves to derive a correct voltage for operation of the DDR SDRAM protocol on and/or coupled through the riser card outside the PCB from power received through the serial connection external interface of the PCB.

The one or more voltage regulator modules comprise a set of voltage regulator modules. The riser card connects with a parallel connection external interface of a memory module that employs a parallel memory protocol on and/or coupled through the riser card outside the PCB. The set of voltage regulator modules serves to derive a correct voltage for the memory module from power received through the serial connection external interface of the PCB. The set of voltage regulator modules serves to route the correct voltage to the memory module for operation of the memory module.

An exemplary approach comprises automatically and dynamically configuring power rails to an industry-standard socket to provide power that is correct for and/or aligned with real-time power needs of a field replaceable unit (FRU) contemporaneous with connection of the FRU with the industry-standard socket.

There is made a determination that the FRU comprises a locally supported-technology FRU.

An implementation of the apparatus 100 in an example comprises a plurality of components such as one or more of electronic components, chemical components, organic components, mechanical components, hardware components, optical components, and/or computer software components. A number of such components can be combined or divided in an implementation of the apparatus 100. In one or more exemplary implementations, one or more features described herein in connection with one or more components and/or one or more parts thereof are applicable and/or extendible analogously to one or more other instances of the particular component and/or other components in the apparatus 100. In one or more exemplary implementations, one or more features described herein in connection with one or more components and/or one or more parts thereof may be omitted from or modified in one or more other instances of the particular component and/or other components in the apparatus 100. An exemplary technical effect is one or more exemplary and/or desirable functions, approaches, and/or procedures. An exemplary component of an implementation of the apparatus 100 employs and/or comprises a set and/or series of computer instructions written in or implemented with any of a number of programming languages, as will be appreciated by those skilled in the art. An implementation of the apparatus 100 in an example comprises any (e.g., horizontal, oblique, angled, or vertical) orientation, with the description and figures herein illustrating an exemplary orientation of an exemplary implementation of the apparatus 100, for explanatory purposes.

An implementation of the apparatus 100 in an example encompasses an article. The article comprises one or more computer-readable signal-bearing media. The article comprises means in the one or more media for one or more exemplary and/or desirable functions, approaches, and/or procedures.

An implementation of the apparatus 100 in an example employs one or more computer readable signal bearing media. A computer-readable signal-bearing medium in an example stores software, firmware and/or assembly language for performing one or more portions of one or more implementations. An example of a computer-readable signal bearing medium for an implementation of the apparatus 100 comprises a memory and/or recordable data storage medium of the riser card 102, PCB 104, and/or serial protocol memory module 128. A computer-readable signal-bearing medium for an implementation of the apparatus 100 in an example comprises one or more of a magnetic, electrical, optical, biological, chemical, and/or atomic data storage medium. For example, an implementation of the computer-readable signal-bearing medium comprises one or more floppy disks, magnetic tapes, CDs, DVDs, hard disk drives, and/or electronic memory. In another example, an implementation of the computer-readable signal-bearing medium comprises a modulated carrier signal transmitted over a network comprising or coupled with an implementation of the apparatus 100, for instance, one or more of a telephone network, a local area network ("LAN"), a wide area network ("WAN"), the Internet, and/or a wireless network.

The steps or operations described herein are examples. There may be variations to these steps or operations without departing from the spirit of the invention. For example, the steps may be performed in a differing order, or steps may be added, deleted, or modified.

Although exemplary implementation of the invention has been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A method, comprising:
   identifying, by a controller, a type of a field replaceable unit (FRU) plugged into a socket of a system board;
   in response to an identification of a first type of FRU:
      controlling a first switch to couple a first voltage rail to a first socket pin of the socket, wherein the first voltage rail provides a first voltage level;
      controlling a second switch to couple a second voltage rail to a second socket pin of the socket, wherein the second voltage rail provides a second voltage level;
   in response to an identification of a second type of the FRU:
      controlling the first switch and the second switch to short couple the first socket pin and the second socket pin to a third voltage rail, wherein the third voltage rail provides a third voltage level.

2. The method of claim 1, wherein the first voltage level and the second voltage level are different voltage levels selected from a set comprising 1.5V, 1.8V, 0.9V, and 0.75V.

3. The method of claim 2, wherein the third voltage level is 12V.

4. The method of claim 1, wherein the first type of FRU comprises FRUs with at least one local power converter, and wherein the second type of FRU comprises FRUs without local power converters.

5. The method of claim 1, wherein controlling the first switch and the second switch to couple the first socket pin and the second socket pin to the third voltage rail comprises:
   controlling the first switch and the second switch to short the first socket pin and the second socket pin to the third voltage rail.

6. The method of claim 1, wherein the first, second, and third voltage rails differ in voltage level.

7. The method of claim 1, wherein the first type of FRU comprises an FRU with a least one local point of load (POL) power converter; and
   wherein the second type of FRU comprises an FRU without any local POL power converters.

8. An apparatus, comprising:
   a memory socket on a system board to receive a field replaceable unit (FRU);
   a first voltage rail on the system board;
   a second voltage rail on the system board;
   a third voltage rail on the system board; and
   a controller on the system board to:
      identify a type of a field replaceable unit (FRU) plugged into the memory socket of the system board;
      in response to an identification of the type as a first FRU type:
         control a first switch to couple the first voltage rail to a first socket pin of the memory socket, wherein the first voltage rail provides a first voltage level;
         control a second switch to couple the second voltage rail to a second socket pin of the memory socket, wherein the second voltage rail provides a second voltage level;
      in response to an identification of the type as a second FRU type:
         control the first switch and the second switch to couple the first socket pin and the second socket pin to the third voltage rail, wherein the third voltage rail provides a third voltage level.

9. The apparatus of claim 8, wherein the controller is to control the first switch and the second switch to couple the first socket pin and the second socket pin to the third voltage rail by controlling the first switch and the second switch to short the first socket pin and the second socket pin to the third voltage rail.

10. The apparatus of claim 8, wherein the first voltage level and the second voltage level are different voltage levels from a set comprising 1.5V, 1.8V, 0.9V, and 0.75V.

11. The apparatus of claim 8, further comprising:
   a fourth voltage rail; and
   wherein the controller is further to, in response to an identification of the type as the first FRU type:
      control a third switch to couple the fourth voltage rail to a third socket pin, wherein the fourth voltage rail provides a fourth voltage level.

12. The apparatus of claim 11, wherein the controller is further to, in response to an identification of the type as the second FRU type:
   control the third switch to an open state, instead of coupling the third socket pin to the third voltage rail.

13. The apparatus of claim 8, further comprising:
   a translator to translate between a serial memory protocol used by the system board and a parallel memory protocol used by a riser card coupled to the memory socket or another FRU plugged into a socket of the riser card.

14. An apparatus, comprising:
   a controller to:
      identify a type of a field replaceable unit (FRU) plugged into an industry-standard memory socket of a system board;

in response to an identification of the type of the FRU as a first FRU type that includes a voltage regulator:
control a first switch to couple a first voltage rail to a first socket pin of the socket, wherein the first voltage rail provides a first voltage level;
control a second switch to couple a second voltage rail to a second socket pin of the socket, wherein the second voltage rail provides a second voltage level;
in response to an identification of the type of the FRU as a second FRU type that does not include any voltage regulator:
control the first switch and the second switch to couple the first socket pin and the second socket pin to a third voltage rail, wherein the third voltage rail provides a third voltage level.

15. The apparatus of claim 14, wherein the controller is to control the first switch and the second switch to couple the first socket pin and the second socket pin to the third voltage rail by controlling the first switch and the second switch to short the first socket pin and the second socket pin to the third voltage rail.

16. The apparatus of claim 14, wherein the first, second, and third voltage rails differ in voltage level.

17. The apparatus of claim 14, wherein the controller is further to, in response to an identification of the type of the FRU as the second FRU type:
control a third switch for a third socket pin to couple the third socket pin also to the third voltage rail.

18. The apparatus of claim 14, wherein the controller is further to, in response to an identification of the type of the FRU as the second FRU type:
control a third switch for a third socket pin to an open state.

19. The apparatus of claim 14, wherein the first voltage level and the second voltage level are different voltage levels from a set comprising 1.5V, 1.8V, 0.9V, and 0.75V; and
wherein the third voltage level is 12V.

20. The apparatus of claim 14, further comprising:
a translator to translate between a serial memory protocol used by the system board and a parallel memory protocol used by a riser card coupled to the memory socket or another FRU plugged into a socket of the riser card.

* * * * *